(12) United States Patent
Brown

(10) Patent No.: US 6,325,903 B1
(45) Date of Patent: Dec. 4, 2001

(54) PARALLEL ACTION HOLDING CLAMP FOR ELECTROPLATING ARTICLES

(76) Inventor: Howard Brown, 16, St-Joachim, Pointe-Claire, Quebec (CA), H9S 4P1

( * ) Notice: Subject to any disclaimer, the term of this patent is extended or adjusted under 35 U.S.C. 154(b) by 0 days.

(21) Appl. No.: 09/618,460

(22) Filed: Jul. 18, 2000

Related U.S. Application Data

(63) Continuation-in-part of application No. 09/497,704, filed on Feb. 4, 2000, now Pat. No. 6,267,856.

(51) Int. Cl.[7] ....................................................... C25B 9/00
(52) U.S. Cl. .................. 204/279; 204/286.1; 204/288.1; 204/288.3; 204/297.06; 204/297.07; 204/297.09; 204/297.1; 204/297.14
(58) Field of Search ............................... 204/279, 297.06, 204/297.07, 297.09, 297.1, 297.14, 286.1, 288.1, 288.3

(56) References Cited

U.S. PATENT DOCUMENTS

| 1,282,259 | | 10/1918 | Merritt . | |
|---|---|---|---|---|
| 2,190,440 | | 2/1940 | Beebe . | |
| 2,367,909 | | 1/1945 | Wanner . | |
| 5,380,418 | * | 1/1995 | Strecker | 204/297.09 |
| 5,456,814 | * | 10/1995 | Metzka | 204/297.09 |
| 5,876,585 | * | 3/1999 | Schank | 204/279 |
| 5,901,997 | * | 5/1999 | Bayer | 204/297.09 |
| 5,904,820 | | 5/1999 | Brown et al. . | |
| 5,932,081 | * | 8/1999 | Kopp et al. | 204/297.09 |

FOREIGN PATENT DOCUMENTS 1215939    12/1986   (CA) .

* cited by examiner

*Primary Examiner*—Bruce F. Bell
(74) *Attorney, Agent, or Firm*—Francois Martineau

(57) ABSTRACT

A holding clamp device, for releasably holding a thick planar article over ground, comprising: an elongated main arm member, defining first and second opposite end portions; a pair of first and second tubular bar members, each defining an outer end portion and an opposite inner end portion; a rail member, integral to an intermediate section of the main arm member and slidably engaged by the second bar member inner end portion, wherein the second bar member is maintained by the rail member parallel to the first bar and wherein the second bar member is movable relative to the first bar member while continuously remaining parallel thereto; a first biasing member, continuously biasing the first and second bar members toward one another; and a second biasing member, for discretely biasing the second bar member away from the first bar member, against the continuous bias of the first biasing member. The second biasing member includes a cantilever arm, transversely carried at one end of a handle bar member, and a pivot mount, pivotally mounting the cantilever arm between the two bar members inner end portions. By pivotally pushing the handle bar toward the registering section of the main arm member, the two bar members are spread apart from one another.

7 Claims, 6 Drawing Sheets

PARALLEL ACTION HOLDING CLAMP FOR ELECTROPLATING ARTICLES

CROSS-REFERENCE DATA

This is a Continuation-In-Part of patent application Ser. No. 09/497,704 filed Feb. 4, 2000, now U.S. Pat. No. 6,267,856.

FIELD OF THE INVENTION

The present invention relates to a clamp for holding thick planar articles such as thickened plates or the like, and more particularly to a clamp for holding multi-layer printed circuit boards in an electroplating acid bath.

BACKGROUND OF THE INVENTION

It is known in the art of electroplating to use frames on which are removably anchored plates or the like articles to be plated, for holding them while they are being submerged in large acid tanks or baths, e.g. for creating printed circuit boards.

In applicant's U.S. Pat. No. 5,904,820 issued May 18, 1999, there was disclosed and claimed a holding clamp for releasably holding an article to be submerged in a liquid solution bath ahead of a submerged anode bar and to be electroplated therein. This patented holding clamp, destined to downwardly depend from an overlying cathode frame bar, comprises a first and a second elongated arm members made of an electrically conducting material and each defining a lower portion coated with a fluid-tight and electrically insulating sleeve, and an upper and a lower end, the first arm member to be fixedly attached to the cathode frame bar at its upper end, the second arm member being shorter than the first arm member and being pivotally attached to the first arm member and being pivotable between a first limit position in which the lower ends are spaced from one another and a second limit position in which the lower ends abut against one another, the first arm member having electrical current conduction means physically accessible at its lower end. Biasing means biases the arm members lower ends against one another, and a lever member pivotally attached to an intermediate section of the first arm member and located entirely above the first and second arm member sleeves at all times selectively forcibly pivotally biases the second arm member into the first limit position against the action of the biasing means. In this way, the first and second arm members are destined to frictionally hold the article to be electroplated between their lower ends when the second arm member is in its second limit position, thus allowing current to be conducted through the conduction means into the article, with the first and second arm member lower portions destined to be submerged in the solution at the most partially up their sleeves.

Such a holding clamp device is very efficient for holding thin single layer planar articles. However, recent technical developments in the printed circuit boards have brought about thicker, multiple layer printed boards. Because of their greater overall thickness, the jaw studs of the prior art holding clamps are much more spread apart than before. Since the relative movement between the two jaws is a pivotal one about a circle of an arc, when the jaws are opened from their closed condition, the jaws do not remain parallel to one another and accordingly, the studs become eventually axially offset relative to one another. This means that electrical conduction between the studs from the two opposite jaws from a given clamp, becomes compromised in a progressively increasing fashion as the jaws are progressively pivoted away from one another.

In applicant's co-pending parent application, Ser .No. 09/497,704, there is disclosed a holding clamp for releasably holding a thickened planar article to be submerged in a liquid solution bath ahead of a submerged anode bar and to be electroplated therein, said holding clamp destined to downwardly depend from an overlying cathode frame bar, said holding clamp comprising: a) an elongated main arm member, made from an electrically conducting material, and defining first and second opposite end portions; b) a pair of first and second tubular bar members, each defining an outer end portion coated with a fluid-tight and electrically insulating sleeve and an opposite inner end portion, each bar member outer end portion having a transverse terminal stud projecting therefrom, said first bar member anchored at its said inner end portion to said main arm member first end portion parallel thereto; c) a rail member, integral to an intermediate section of said main arm member and slidably engaged by said second bar member inner end portion, wherein said second bar member is maintained by said rail member parallel to said first bar and wherein said second bar member is movable relative to said first bar member while continuously remaining parallel thereto, while the pair of said terminal studs remain coaxially aligned; d) a first biasing member, continuously biasing said first and second bar members toward one another; and e) a second biasing member, for discretely biasing said second bar member away from said first bar member, against the continuous bias of said first biasing member.

In application Ser. No. 09/497,704, the first biasing means includes at least one pair of coil springs, hookingly interconnecting said first and second bar members. The second biasing member includes an arcuate cantilever member defining an engagement leg and an opposite elongated actuation leg, said engagement leg extending between said first and second bar members within their common plane, a pivotal linkage assembly integral to said main arm member and pivotally mounting an intermediate section of said arcuate cantilever member; wherein upon pulling force actuation of said actuation leg to move the latter away from said main arm member, pivotal motion of said cantilever member will bring about frictional engagement of said cantilever member engagement leg against said second bar member for displacement of the latter away from said first bar member.

A problem that appears once and a while is the vibrations generated by the conventional vibrators used in the acid bath tank, to remove air bubbles that may have struck to cavities on the circuit boards during their lowering into the volume of acid. These vibrations may sometimes be important enough to bring about accidental progressive frictional release of the circuit board from the pair of studs between which the circuit board is taken in sandwich. This is undesirable.

OBJECTS OF THE INVENTION

The gist of the present invention is therefore to improve upon applicant's parent patent application Ser. No. 09/497,704 by providing a simpler mechanism for relative movement of the pair of jaws from an article holding device, that will still constantly maintain the pair of jaws parallel to one another during their relative movement to accommodate therebetween an article of varying thickness to be frictionally taken in sandwich therebetween.

A further object of the present invention is to conveniently reverse to a lever arm pushing force in the present patent application, the pulling force that was required for spreading apart the pair of jaws of the holding device as in the parent patent application.

An important object of the invention is to overcome the vibration problem from acid bath vibrators that can accidentally release the circuit board from their sandwiching studs, as discussed in the preceding background of the invention paragraph, by providing an improved holding clamp for holding a thick planar article which holding clamp will not release its planar article from air-bubble dislodging vibrator borne forces.

General objects of this invention include: that the holding device be easy and quick to operate; and that the holding device require only one operation for installing or retrieving an article therefrom.

SUMMARY OF THE INVENTION

In accordance with the teachings of the invention, there is disclosed a holding clamp for releasably holding a thickened planar article to be submerged in a liquid solution bath ahead of a submerged anode bar and to be electroplated therein, said holding clamp destined to downwardly depend from an overlying cathode frame bar, said holding clamp comprising: a) an elongated main arm member, made from an electrically conducting material, and defining first and second opposite end portions; b) a pair of first and second tubular bar members, each defining an outer end portion coated with a fluid-tight and electrically insulating sleeve and an opposite inner end portion, each bar member outer end portion having a transverse terminal stud projecting therefrom, said first bar member anchored at its said inner end portion to said main arm member first end portion parallel thereto; c) a rail member, integral to an intermediate section of said main arm member and slidably engaged by said second bar member inner end portion, wherein said second bar member is maintained by said rail member parallel to said first bar and wherein said second bar member is movable relative to said first bar member while continuously remaining parallel thereto, while the pair of said terminal studs are directed toward one another and remain coaxially aligned; d) a first biasing member, cooperating with said rail member and continuously biasing said first and second bar members toward one another; and e) a second biasing member, for discretely biasing said second bar member away from said first bar member, against the continuous bias of said first biasing member; said second biasing member including an arcuate cantilever member defining an engagement leg, an intermediate actuation leg transverse to said engagement leg, a handle bar opposite said engagement leg and extending generally away from said first and second bar members and integral and transverse to said actuation leg, said engagement leg extending between said first and second bar members within their common plane, and a pivotal mount integral to said main arm member and pivotally carrying a section of said arcuate cantilever member intermediate said engagement and actuation legs, said pivot mount defining a pivotal axis orthogonal to the plane intersecting said first and second bar members; wherein said engagement leg of cantilever member is engageable with said second bar member inner end portion, so that upon push actuation of said handle bar toward said main arm member, pivotal motion of said cantilever member brings about frictional engagement of said cantilever member engagement leg about said second bar member and displacement of the latter away from said first bar member.

Preferably, said first biasing means includes two pairs of coil springs, hookingly interconnecting said first and second bar members on opposite sides of said cantilever member engagement leg.

Preferably also, said cantilever member engagement leg includes a free end bevelled tip portion. A carriage, would be integrally mounted to said second bar member inner end portion, and an open cavity member, projecting from said first bar member outer end portion, said carriage sized for sliding engagement into said open cavity member, said cantilever member bevelled tip end portion frictionally slidingly engaging directly said carriage member upon pushing force being applied against said handle bar.

A bulge could also be located on an intermediate section of said cantilever member, said cantilever member bulge abutting against said main arm member at a limit released condition of said cantilever member when said studs abut one another.

DETAILED DESCRIPTION OF THE PREFERRED EMBODIMENTS

Figure 1:
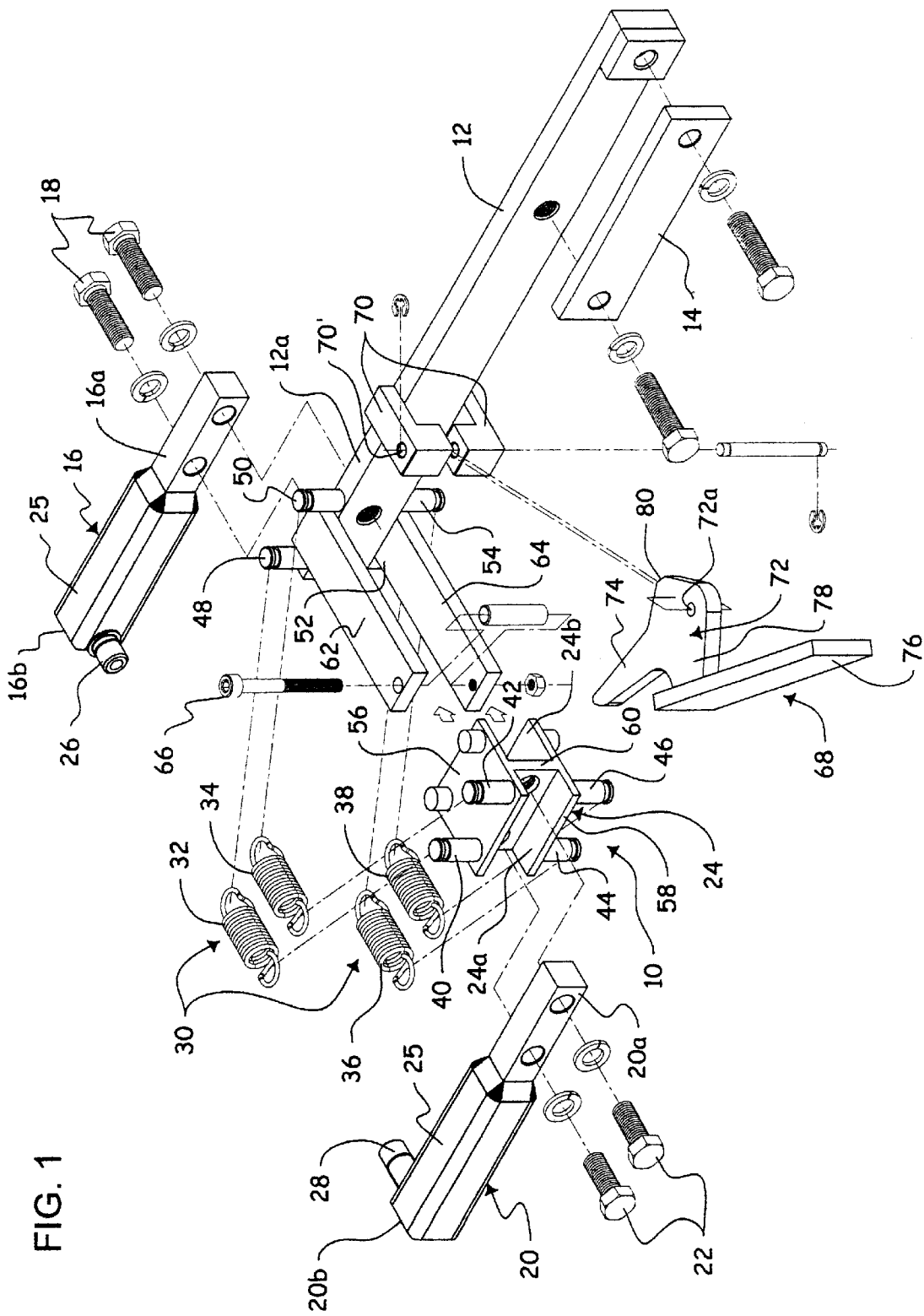
FIG. 1 is an exploded view of the embodiment of holding clamp, in accordance with the present invention.
Figure 2:
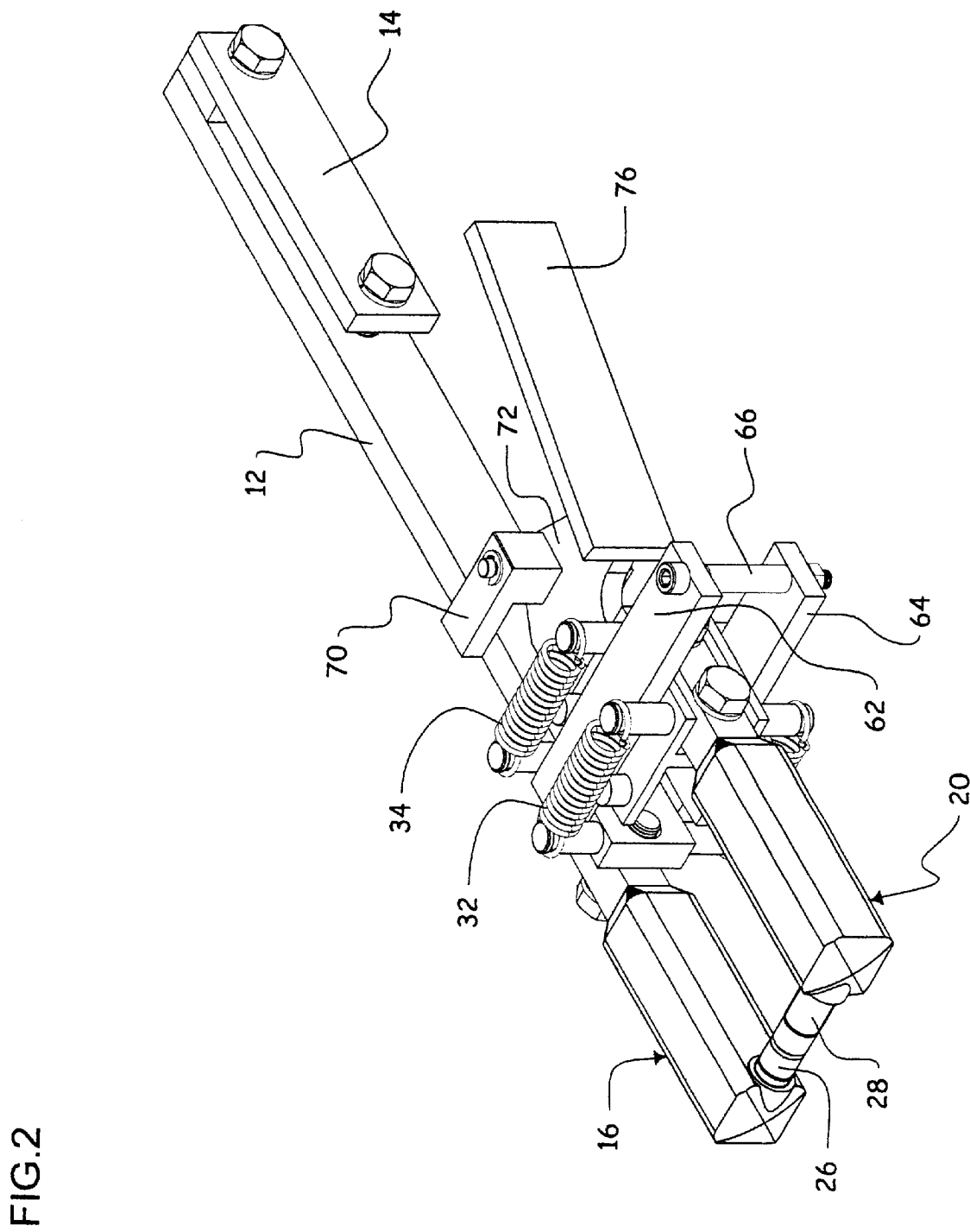
FIG. 2 is a perspective view of the assembled holding clamp, with the jaws in their closed default condition, and showing the actuator lever handle in its diverging position away from the main arm.
Figure 3:
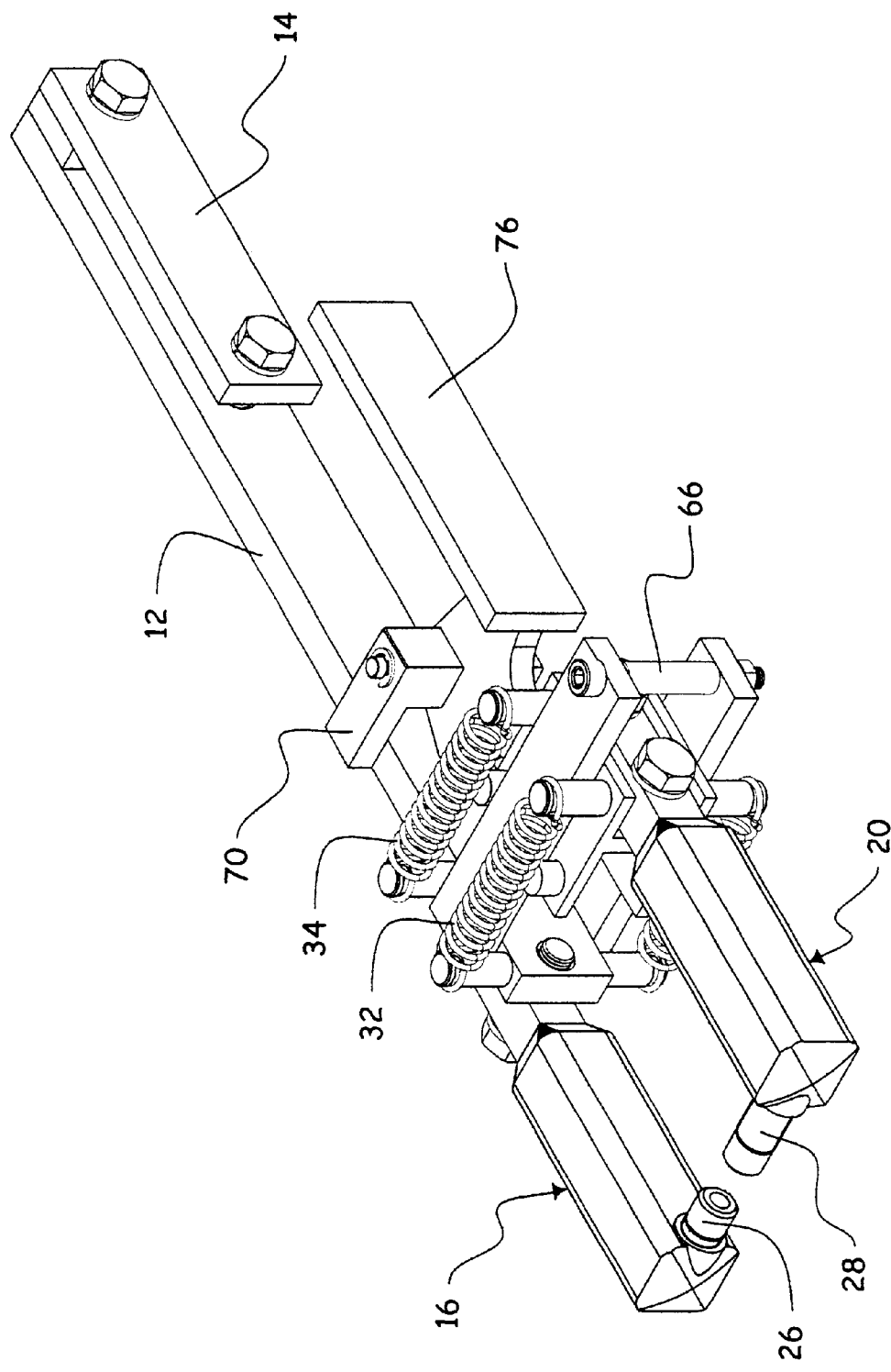
FIG. 3 is a view of the holding clamp similar to FIG. 2, but with the jaws spread apart and with the actuator lever handle brought toward the main base arm.

The embodiment of holding clamp 10 according to the present invention is illustrated in FIGS. 1–6. Holding clamp 10 includes an elongated main clamp arm 12 having at one end a fastening band assembly 14, for transverse attachment of the horizontal support element (as already discussed in applicant prior U.S. Pat. No. 5,904 820, supra).

A first stud support tubular bar 16 is fixedly transversely anchored by bolts 18, at one inner end portion thereof 16a, to the clamp arm end portion 12a parallel thereto. A second stud support tubular bar 20 is fixedly anchored by bolts 22, at one inner end portion thereof 20a to a carriage member 24. This tubular bar end portion 20a is engaged into a complementary open channel section 24a made in the carriage member 24.

Each tubular bar 16, 20, is as generally described in applicant's U.S. Pat. No. 5,904,820, supra, and thus further includes an outer end portion 16b, 20b, covered by a corrosion-resistant, fluid-tight and electrically insulating protective sheath 25, opposite inner end portions 16a, 20a; and a cylindroid stud 26, 28, respectively, projecting inwardly transversely from the corresponding free end 16b, 20b, of sheathed end portion 25, the studs 26, 28, being coaxially aligned and directed toward one another.

Biasing means 30 are provided to continuously bias tubular arms 16, 20, toward one another, and thus, the free inner ends 16b, 20b, of the cylindroid studs 26, 28, respectively, coaxially against one another (typically taking a planar board article in sandwich therebetween). Preferably, biasing means 30 includes two pairs of coil springs 32, 34, and 36, 38, one end of which hook around two pairs of opposite ears 40, 42 and 44, 46, which transversely project from carriage member 24 orthogonally to the plane intersecting the two tubular stud bars 16, 20, while the opposite end of these four coil springs 32–38 hook around two pairs of opposite ears 48, 50 and 52, 54, projecting transversely from the end portion 12a of the clamp main arm 12 and parallel to ears 40–46. Ears 40, 42 extend in a direction opposite ears 44, 46, while ears 48, 50, extend in a direction opposite ears 52, 54.

Figure 4:
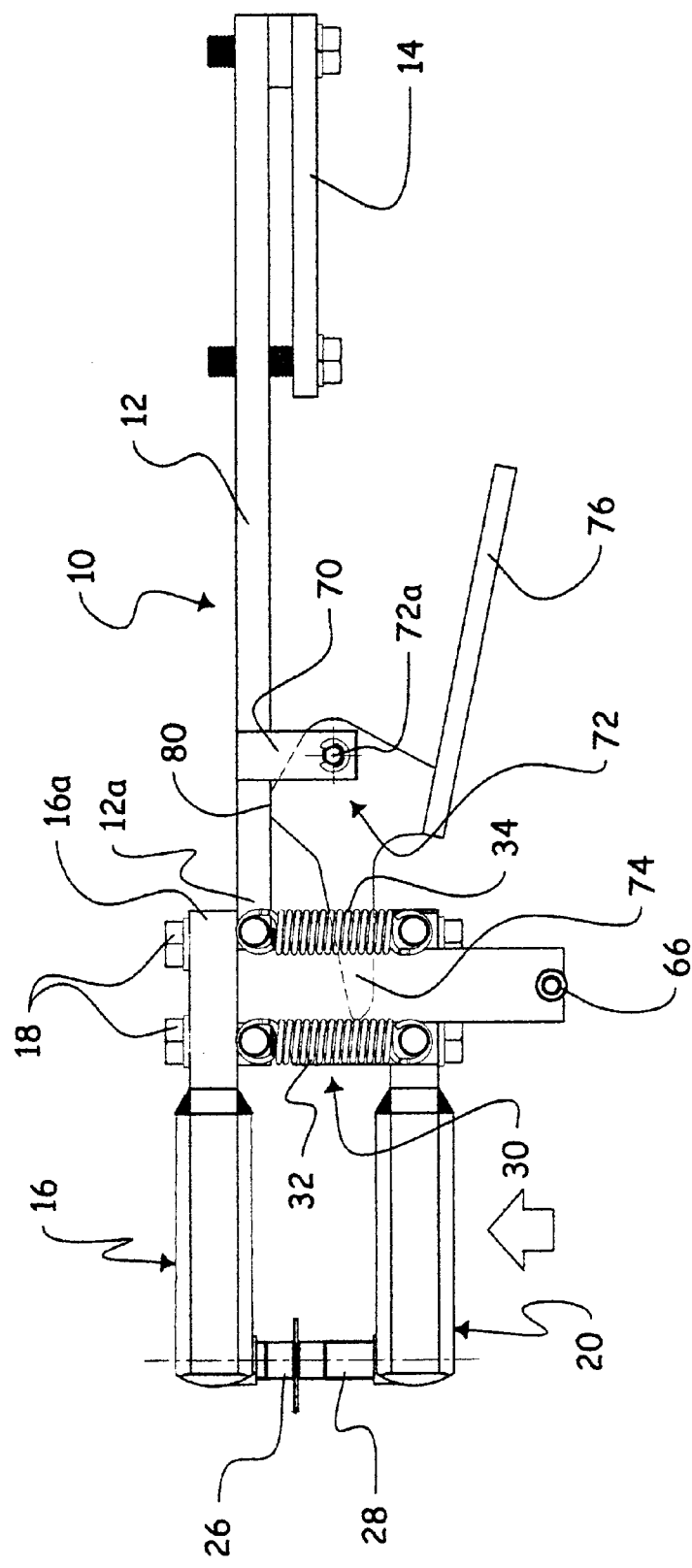
FIGS. 4 and 5 are plan views of the clamp of FIGS. 2 and 3, respectively.
Figure 5:
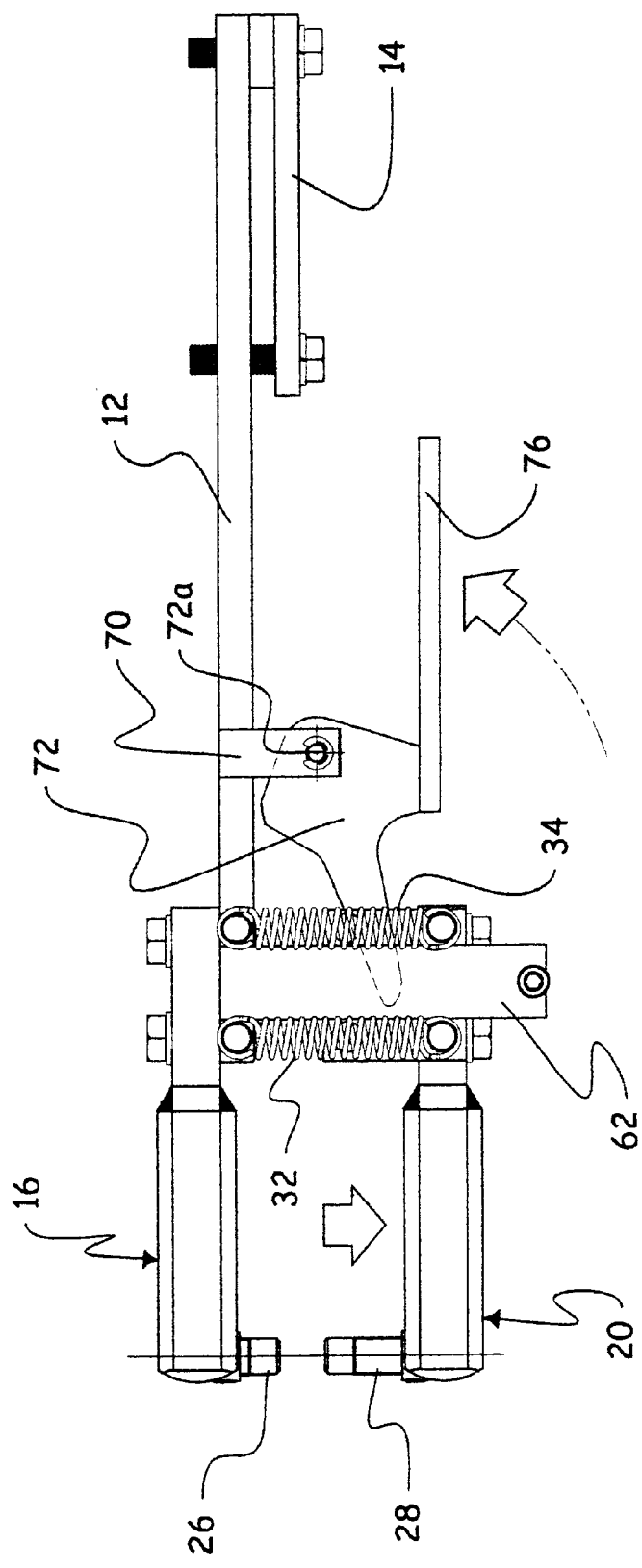
Figure 6:
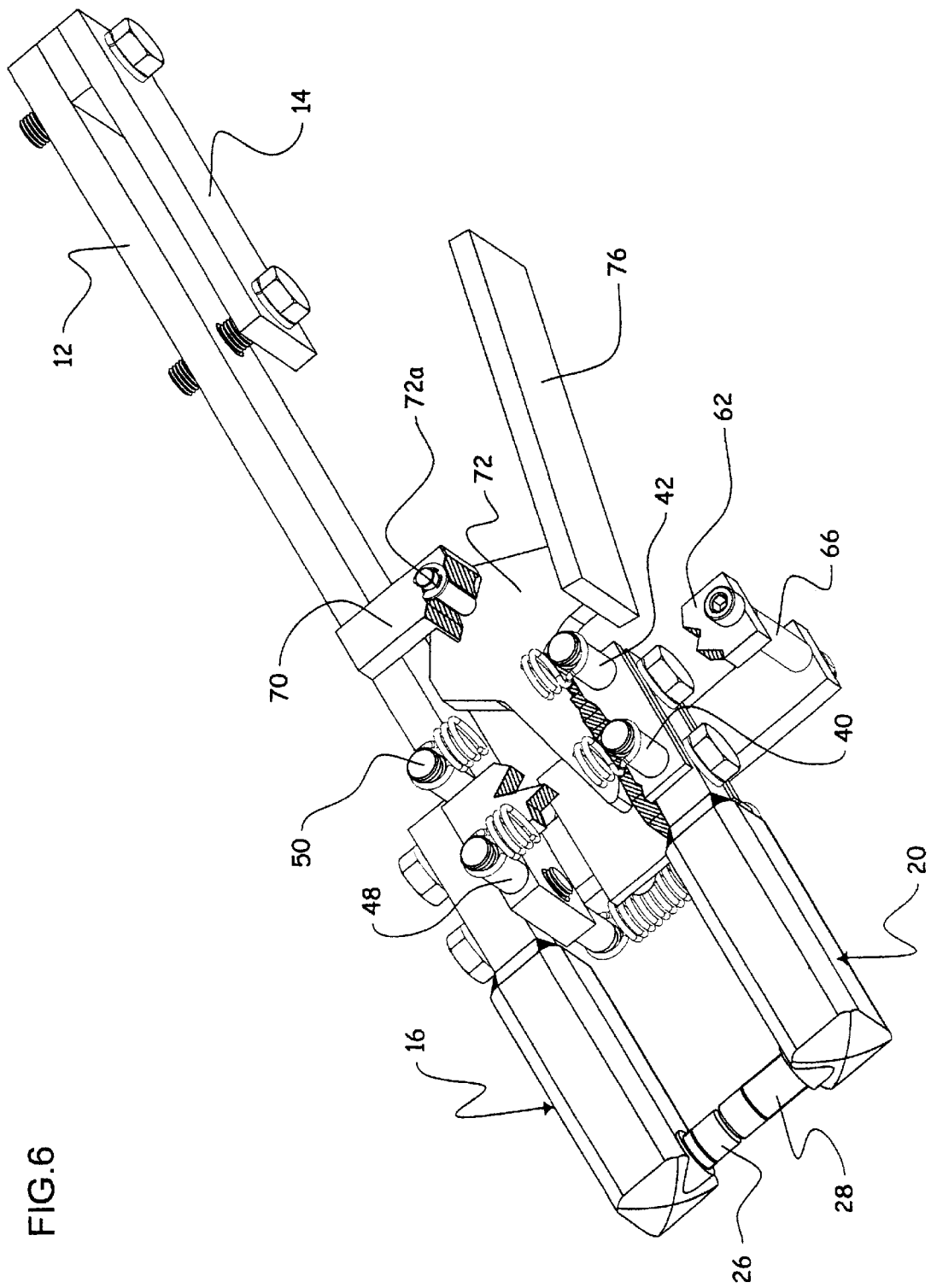
FIG. 6 is a partly broken perspective view of the clamp with the jaws thereof being open, at a larger scale than FIG. 3, and with part of the casing thereof being broken for clarity of the view of the cantilever arm.

It is noted that coil springs 32-38 continuously bias the opposite pair of otherwise spaced studs 26, 28, to firmly coaxially abut against each other, while the tubular bars 16, 20, remain consequently spaced from one another and parallel to one another. As the tubular bars 16, 20, are forcibly spread apart to put a planar board article in between the studs 26, 28, the coil springs 32-38 are stretched (FIG. 5) from their initial released condition (FIG. 4).

As illustrated in FIG. 1 of the drawings, carriage 24 is cross-sectionally H-shape, with two opposite flat plates 56, 58, integrally interconnected by an intermediate transverse web 60, so that two opposite U-shape channels 24a, 24b, are formed. Ears 40, 42, integrally project from plate 56 away from plate 58, and cars 44, 46 integrally project from plate 58 away from plate 56. Movable stud bar inner portion 20a snugly fits flatly inside U-channel 24a, with bolts 22 extending transversely through bores in portion 20a and through bores in web 60.

A pair of rectangular arms 62, 64, transversely integrally project from opposite sides of the main stationary bar inner portion 12a, in registering parallel fashion relative to one another. The transverse gap between arms 62, 64, is slightly greater than the total outer distance between the carriage two opposite plates 56, 58, so that the carriage 24 be freely movable through this gap lengthwisely of arms 62, 64 toward or away from arm 12.

Moreover, the width of the rectangular arms 62, 64, is slightly smaller than the inner distance between ears 40 and 42, and between ears 44 and 46, respectively, so that the free end portion of each elongated arm 62, 64, can guidingly pass freely between the two corresponding opposite pairs of ears as the carriage 24 moves through the gap lengthwisely between elongated arms 62 and 64. Coil springs 32-38 bias carriage 24 into this channel gap between arms 62 and 64, toward main arm inner portion 12a.

Preferably, a shaft 66 transversely joins the free end of elongated arms 62, 64, so that carriage 24 be trapped between shaft 66 and main arm inner portion 12a without any possibility of carriage 24 accidentally escaping endwisely from the gap or "open casing" between arms 62 and 64.

A manual cantilever arm assembly 68 is provided to forcibly bias carriage 24 away from arm inner portion 12a, against the bias of coil springs 32–38. Assembly 68 includes a pivot mount 70, installed transversely to main arm 12 proximate to the inner portion thereof. Pivot mount 70 defines a pivotal axis 70' extending orthogonally to the plane intersecting stud arms 16, 20. An arcuate cantilever arm 72 is pivotally engaged by its apex pivot section 72a to pivot mount 70, for pivotal displacement of cantilever arm generally within the plane of stud bars 16, 20. Tapered leg 74 of cantilever arm 72 extends transversely through and into the channel between elongated arms 62 and 64, and in between carriage 24 and main arm inner end portion 12a. A handle 76 transversely projects from the other leg 78 of cantilever arm 72, in a direction generally opposite that of tapered leg 74.

In use, by manually pushing handle 76 pivotally around pivot mount 70 toward the intermediate section of main arm 12, the tapered leg 74 of cantilever arm is pivoted in the opposite direction to come to frictionally slidingly bear against web 60 of carriage 24. By further pushing handle 76 inwardly, cantilever arm leg 74 pushes carriage 24 slidingly away from bar 12, and thus, spreads apart studs 26 and 28. However, studs 26 and 28, even when spread apart, constantly remain coaxial to one another, in view of the operational layout between movable stud arm 20, carriage 24, slider bars 62, 64, and main arm 12.

As shown in FIG. 4, the cantilever arm tapered leg extends into the gap between plates 62 and 64, transversely beyond coil springs 34, 38, but sheet of coil springs 32, 36.

Preferably, cantilever arm 72 includes an intermediate bulge 80, proximate its apex pivotal point 72a, wherein this bulge 80 comes to abut against main bar 12 once handle 70 is released to its limit position (shown in FIG. 4) farthest from main bar 12, thus forming a stopper defining a limit position of handle 70. Bulge 80 thus abuts on main bar 12 in the closed condition of stud bars 16, 20, but facilitate the lever action of handle 76 when stud bars 16, 20, arc to be spread apart.

I claim:

1. A holding clamp for releasably holding a thickened planar article to be submerged in a liquid solution bath ahead of a submerged anode bar and to be electroplated therein, said holding clamp destined to downwardly depend from an overlying cathode frame bar, said holding clamp comprising:

a) an elongated main arm member, made from an electrically conducting material, and defining first and second opposite end portions;

b) a pair of first and second tubular bar members, each defining an outer end portion coated with a fluid-tight and electrically insulating sleeve and an opposite inner end portion, each bar member outer end portion having a transverse terminal stud projecting therefrom, said first bar member anchored at its said inner end portion to said main arm member first end portion parallel thereto;

c) a rail member, integral to an intermediate section of said main arm member and slidably engaged by said second bar member inner end portion, wherein said second bar member is maintained by said rail member parallel to said first bar and wherein said second bar member is movable relative to said first bar member while continuously remaining parallel thereto, while the pair of said terminal studs are directed toward one another and remain coaxially aligned;

d) a first biasing member, cooperating with said rail member and continuously biasing said first and second bar members toward one another; and e) a second biasing member, for discretely biasing said second bar member away from said first bar member, against the continuous bias of said first biasing member;

said second biasing member including an arcuate cantilever member defining an engagement leg, an intermediate actuation leg transverse to said engagement leg, a handle bar opposite said engagement leg and extending generally away from said first and second bar members and integral and transverse to said actuation leg, said engagement leg extending between said first and second bar members within their common plane, and a pivotal mount integral to said main arm member and pivotally carrying a section of said arcuate cantilever member intermediate said engagement and actuation legs, said pivotal mount defining a pivotal axis orthogonal to the plane intersecting said first and second bar members;

wherein said engagement leg of cantilever member is engageable with said second bar member inner end portion, so that upon push actuation of said handle bar toward said main arm member, pivotal motion of said cantilever member brings about frictional engagement of said cantilever member engagement leg about said second bar member and displacement of the latter away from said first bar member.

2. A holding clamp as in claim 1, wherein said first biasing means includes two pairs of coil springs, hookingly interconnecting said first and second bar members on opposite sides of said cantilever member engagement leg.

3. A holding clamp as in claim 2, wherein said cantilever member engagement leg includes a free end bevelled tip portion.

4. A holding clamp as in claim 3, further including a carriage, integrally mounted to said second bar member inner end portion, and an open cavity member, projecting from said first bar member outer end portion, said carriage sized for sliding engagement into said open cavity member, said cantilever member bevelled tip end portion frictionally slidingly engaging directly said carriage member upon pushing force being applied against said handle bar.

5. A holding clamp as in claim 4, further including a series of ears transversely carried by said carriage, said ears forming anchor points for the hooking of said coil springs, said ears further forming guide members slidable edgewisely of said open cavity member for preventing said carriage from accidentally escaping transversely from said open cavity member.

6. A holding clamp as in claim 5, further including a bulge located on an intermediate section of said cantilever member, said cantilever member bulge abutting against said main arm member at a limit released condition of said cantilever member when said studs abut one another.

7. A holding clamp as in claim 5, wherein said open cavity member defines an end mouth, said mouth closed by a transverse shaft to prevent accidental endwise release of said carriage from said open cavity member.

* * * * *